(12) United States Patent
Wang et al.

(10) Patent No.: US 11,917,769 B2
(45) Date of Patent: Feb. 27, 2024

(54) METHOD FOR FABRICATING ASYMMETRIC BOARD

(71) Applicant: SHENZHEN KINWONG ELECTRONIC CO., LTD., Guangdong (CN)

(72) Inventors: Jun Wang, Guangdong (CN); Xiaoqing Chen, Guangdong (CN); Qian Chen, Guangdong (CN)

(73) Assignee: SHENZHEN KINWONG ELECTRONIC CO., LTD., Guangdong (CN)

( * ) Notice: Subject to any disclaimer, the term of this patent is extended or adjusted under 35 U.S.C. 154(b) by 0 days.

(21) Appl. No.: 17/768,665

(22) PCT Filed: Mar. 4, 2021

(86) PCT No.: PCT/CN2021/079081
§ 371 (c)(1),
(2) Date: Apr. 13, 2022

(87) PCT Pub. No.: WO2021/208629
PCT Pub. Date: Oct. 21, 2021

(65) Prior Publication Data
US 2023/0164927 A1 May 25, 2023

(30) Foreign Application Priority Data
Apr. 15, 2020 (CN) .......................... 202010297206.0

(51) Int. Cl.
*H05K 3/46* (2006.01)
*H05K 1/02* (2006.01)
*H05K 3/00* (2006.01)

(52) U.S. Cl.
CPC ......... *H05K 3/4611* (2013.01); *H05K 1/0271* (2013.01); *H05K 3/0052* (2013.01);
(Continued)

(58) Field of Classification Search
CPC .. H05K 3/4611; H05K 3/0052; H05K 3/0097; H05K 3/4688; H05K 1/0271;
(Continued)

(56) References Cited

U.S. PATENT DOCUMENTS 10,548,217 B1 * 1/2020 Takahashi ............ H05K 1/0298
10,784,421 B2 * 9/2020 Boss ....................... H01L 33/54
(Continued)

FOREIGN PATENT DOCUMENTS

CN       105101671 A    11/2015
CN       105828526 A    8/2016
(Continued)

OTHER PUBLICATIONS

International Search Report for CN2021079081, prepared by the CN National IP Administration, dated May 21, 2021, 5 pages including English Translation.

*Primary Examiner* — Jeffrey T Carley
(74) *Attorney, Agent, or Firm* — Brooks Kushman P. C.; John E. Nemazi

(57) ABSTRACT

The present application relates to the technical field of circuit board fabricating, and provides a method for fabricating an asymmetric board, the method includes fabricating a master board, fabricating a second sub-board, thermal compression bonding the master board and the second sub-board, and milling an asymmetric board; further includes at least one of the following three steps: laying copper on the connection areas of the master board except for the second copper layer of an outermost layer to obtain laying copper area, removing copper on the connection areas of the third copper layer, and after the step of milling the asymmetric board, on each of the sub-boards, performing
(Continued)

depth control milling at the connection areas from a side of the second sub-board on each sub-board to obtain a depth control groove.

15 Claims, 8 Drawing Sheets

(52) U.S. Cl.
 CPC ......... *H05K 3/0097* (2013.01); *H05K 3/4688* (2013.01); *H05K 2201/068* (2013.01); *H05K 2201/09036* (2013.01); *H05K 2203/061* (2013.01)

(58) Field of Classification Search
 CPC ... H05K 2201/068; H05K 2201/09036; H05K 2203/061
 See application file for complete search history.

(56) References Cited

U.S. PATENT DOCUMENTS

| | | | | |
|---|---|---|---|---|
| 2002/0162214 A1* | 11/2002 | Hetherton | ............... | H01C 17/28 29/830 |
| 2003/0000079 A1* | 1/2003 | Harada | ................. | H01L 21/481 29/830 |
| 2005/0230835 A1* | 10/2005 | Sunohara | ............... | H05K 1/185 257/E23.178 |
| 2009/0107702 A1* | 4/2009 | Samejima | .............. | H05K 3/445 29/829 |
| 2010/0038125 A1* | 2/2010 | Kumar | ................. | H05K 3/4614 174/262 |
| 2011/0291293 A1* | 12/2011 | Tuominen | ........... | H01L 23/5389 257/774 |
| 2012/0055706 A1* | 3/2012 | Mok | ...................... | H05K 1/162 29/25.41 |
| 2012/0217048 A1* | 8/2012 | Leahy | .................... | H01L 24/97 174/258 |
| 2012/0241206 A1* | 9/2012 | Arai | ..................... | H05K 1/0326 29/846 |
| 2015/0319852 A1* | 11/2015 | Min | ....................... | H05K 3/002 216/13 |
| 2016/0165731 A1* | 6/2016 | Hurwitz | ................. | H01L 24/19 216/17 |
| 2019/0318984 A1* | 10/2019 | Kim | .................. | H01L 23/49805 |

FOREIGN PATENT DOCUMENTS

| | | | | |
|---|---|---|---|---|
| CN | 205946323 U | 2/2017 | | |
| CN | 206332922 U | 7/2017 | | |
| CN | 107041082 A | 8/2017 | | |
| CN | 109996400 A | 7/2019 | | |
| CN | 110913583 A | 3/2020 | | |
| EP | 0245770 A2 * | 11/1987 | ............... | H05K 1/03 |

\* cited by examiner

METHOD FOR FABRICATING ASYMMETRIC BOARD

CROSS REFERENCE TO RELATED APPLICATION

The present application is a National Phase of an International application with Application No. PCT/CN2021/079081, filed on Mar. 4, 2021, and claims priority of Chinese patent application, with Application No. 202010297206.0, titled "a method for fabricating an asymmetric board", filed on Apr. 15, 2020 to CNIPA, the entire content of which is incorporated herein by reference.

TECHNICAL FIELD

The present application relates to the technical field of circuit board fabricating, and more particularly to a method for fabricating an asymmetric board.

BACKGROUND

The statements here only provide background information related to the present application, and do not necessarily constitute prior art.

With the widespread application of automotive radars, the mixed pressure of different materials and asymmetric laminated structures are more and more widely used in the design of radar boards. Different from the asymmetric laminating of conventional materials, the asymmetric laminating of the radar board is mainly composed of high-frequency materials and ordinary FR4 materials, and generally, formed by a high-frequency core board combined with multiple FR4 core boards. In addition, in order to ensure signal transmission efficiency and reduce loss, the outermost layer where the asymmetric structure is located is usually a high-frequency core board, and the high-frequency core board usually contains PTFE (polytetrafluoroethylene) material. In addition, the assembly is based on sub-boards, and there is a connection areas between one secondary sub-board and another secondary sub-board. According to the normal fabricating process, the circuit board needs to be reflow soldered during assembly, and the temperature is as high as 260° C. In the case of high temperature and large X, Y axis expansion coefficients of PTFE materials, mixed pressure asymmetric laminated high-frequency board warps after pressing. Furthermore, due to thermal stress during assembly, the shrinkage of the high-frequency surface leads to more serious warping, which in turn leads to virtual welding and desoldering after assembly, which seriously affects the assembly effect and product reliability.

The asymmetric laminated circuit board of conventional materials can be drilled in the prepreg on the layer where the asymmetric structure is located to cut off the prepreg arm on the asymmetric side, to reduce torque and release stress. However, in the mixed-pressure asymmetric laminated circuit board of the radar board, the high-frequency core layer where the asymmetric structure is located contains PTFE as the filler, which cannot be made by pressing the prepreg and copper foil. Therefore, it is impossible to achieve the purpose of improving the degree of warping by drilling and releasing the stress in the prepreg where the asymmetric layer is located.

Therefore, for radar boards with mixed materials of different materials and asymmetrical laminating, the problems of warping after pressing and assembling still need to be improved.

Technical Problem

An object of one of embodiments of the present application is to provide a method for fabricating an asymmetric board, aimed to solve the problem of warping of existing asymmetric circuit boards.

SUMMARY

In order to solve above technical problem, the technical solution adopted in an embodiment of the present application is:

A method for fabricating an asymmetric board is provided, the method includes:

fabricating a master board, wherein the master board includes at least one first sub-board, each first sub-board includes a first insulating layer, and a first copper layer and a second copper layer disposed on opposite sides of the first insulating layer;

fabricating a second sub-board, wherein the second sub-board includes a second insulating layer, and a third copper layer and a fourth copper layer disposed on opposite sides of the second insulating layer, and material of the first insulating layer is different from that of the second insulating layer;

thermal compression bonding, laminating the master board and the second sub-board and placing a prepreg between the master board and the second sub-board, wherein the third copper layer is located on a side of the second sub-board away from the master board, the second copper layer is located on a side of the first sub-board away from the second sub-board, and the asymmetric board is formed by thermal compression bonding the master board and the second sub-board; a plurality of sub-boards are formed on the asymmetric board, and each sub-board includes a plurality of secondary sub-boards, the first copper layer to the fourth copper layer are correspondingly formed connection areas between one sub-board and another sub-board, between one secondary sub-board and another secondary sub-board, and between the secondary sub-board and a board edge of the asymmetric board; and milling an asymmetric board; performing milling at the connection areas between one sub-board and another sub-board, the connection areas between the sub-board and the board edge, and the connection areas between one secondary sub-board and another secondary sub-board, to obtain the plurality of sub-boards, and each sub-board includes a plurality of secondary sub-boards connected to each other;

the method for fabricating the asymmetric board further includes a following step:

depth control milling; after the step of milling the asymmetric board, on each of the sub-boards, performing depth control milling at the connection areas between one secondary sub-board and another secondary sub-board from a side of the second sub-board to obtain a depth control groove.

In one embodiment, the method further includes in the step of fabricating the master board, laying copper on the connection areas of the master board except for the second copper layer of an outermost layer to obtain laying copper areas;

In one embodiment, the method further includes in the step of fabricating the second sub-board, removing copper on the connection areas of the third copper layer; and In one embodiment, the laying copper areas between one secondary sub-board and another secondary sub-board are arranged apart from each other, and lengths of two adjacent laying copper areas between one secondary sub-board and another secondary sub-board are different; the laying copper areas between one sub-board and another sub-board are continuously arranged, and the laying copper areas between the secondary sub-board and the board edge are continuously arranged.

In one embodiment, in the multiple laying copper areas between one secondary sub-board and another secondary sub-board, and the two laying copper areas spaced apart have a same shape.

In one embodiment, an unilateral indentation distance of the laying copper areas between one secondary sub-board and another secondary sub-board relative to the connection areas is greater than or equal to 0.15 mm; a distance from the laying copper areas between one sub-board and another sub-board to the secondary sub-board is greater than or equal to 0.2 mm, and a distance from the laying copper areas between the secondary sub-board and the board edge to the secondary sub-board is greater than or equal to 0.2 mm.

In one embodiment, a width of the copper removed area is smaller than a width of a position for milling asymmetric board in the step of milling an asymmetric board.

In one embodiment, a distance between the copper removed area and the position for milling asymmetric board in the step of milling an asymmetric board is greater than or equal to 0.1 mm.

In one embodiment, the step of depth control milling is configured for controlling to mill penetrating the second sub-board and not damage the first copper layer of the master board.

In one embodiment, the method includes the step of removing copper and the step of depth control milling, in the step of removing copper, forming a copper removed area and connection portions located outside the copper removed area on the connection areas of the third copper layer, the step of thermal compression bonding further includes removing the connection portion, and the depth control groove having a minimum depth D0 min=H1−H4+ΔX and a maximum depth D0 max=H1−H4+H3−ΔX, wherein the H1 represents a thickness of the third copper layer, the H3 represents a thickness of the prepreg, the H4 represents a thickness of the third copper layer, and the ΔX represents a precision tolerance of a depth control milling machine.

In one embodiment, the method includes the step of laying copper, in the step of milling an asymmetric board, the position for milling asymmetric board corresponds to a position of part of the laying copper areas.

In one embodiment, the method includes the step of removing copper, in the step of removing copper, forming a copper removed area and connection portions located outside the copper removed area on the connection areas of the third copper layer, and the connection portion corresponds to positions of remaining laying copper areas.

In one embodiment, the method further includes the step of depth control groove, a width of the depth control groove is larger than a width of the layer copper areas in a connection areas of an inner circuit of the second sub-board.

In one embodiment, a distance of a single side of the depth control groove exceeding a single side of the laying copper area in the connection areas in each of the sub-boards is greater than or equal to 0.075 mm.

In one embodiment, in the step of depth control milling, the depth control milling being performed on each of the connection portions, and in each of the sub-boards, a number of the depth control grooves is multiple.

In one embodiment, a distance between an edge of the depth control groove and an edge of the secondary sub-board adjacent to the depth control groove is greater than or equal to 0.075 mm.

In one embodiment, in the step of thermal compression bonding, a temperature drop rate is ranged from 2° C./min~3° C./min.

BENEFICIAL EFFECTS

The beneficial effect of the method for fabricating the asymmetric board provided by the embodiment of the present application is that: the method for fabricating the asymmetric board provided by the embodiment of the present application includes the steps of fabricating a master board, fabricating a second sub-board, thermal compression bonding the master board and the second sub-board, and milling an asymmetric board; further includes at least one of the following three steps: laying copper on the connection areas of the master board except for the second copper layer of an outermost layer to obtain laying copper area, removing copper on the connection areas of the third copper layer, and after the step of milling the asymmetric board, on each of the sub-boards, performing depth control milling at the connection areas from a side of the second sub-board on each sub-board to obtain a depth control groove, any one of the three steps is beneficial to reduce the warping of the asymmetrical board after heating, so as to solve the problem of virtual soldering and desoldering after the circuit board is assembled, and improve the reliability of the product.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

DETAILED DESCRIPTION

In order to make the purpose, the technical solution and the advantages of the present application be clearer and more understandable, the present application will be further described in detail below with reference to accompanying figures and embodiments. It should be understood that the specific embodiments described herein are merely intended to illustrate but not to limit the present application.

It is noted that when a component is referred to as being "fixed to" or "disposed on" another component, it can be directly or indirectly on another component. When a component is referred to as being "connected to" another component, it can be directly or indirectly connected to another component. Terms such as "up", "down" "left", "right" and so on are the directions or location relationships shown in the accompanying figures, which are only intended to describe the present application conveniently and simplify the description, but not to indicate or imply that an indicated device or component must have specific locations or be constructed and manipulated according to specific locations; therefore, these terms shouldn't be considered as any limitation to the present application. In addition, terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s). In the description of the present application, "a plurality of" means two or more, unless there is additional explicit and specific limitation.

In order to illustrate the technical solutions provided by the present application, detailed descriptions are given below in conjunction with specific drawings and embodiments.

Figure 2:
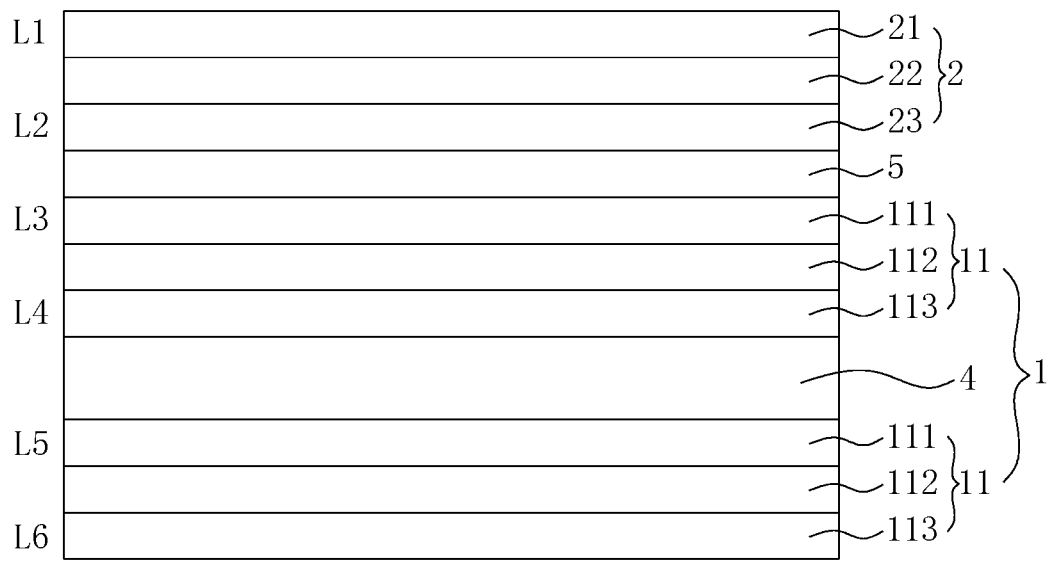
FIG. 2 is a schematic diagram of a laminated structure of an asymmetric board.

Referring to FIG. 2, the asymmetric board 100 includes a master board 1 having a first sub-board 11 or a master board formed by thermal compression bonding a plurality of first sub-boards 11 together, and a second sub-board 2. The first sub-board 11 includes a first insulating layer 112, and a first copper layer 111 and a second copper layer 113 arranged on opposite sides of the first insulating layer 112. The second sub-board 2 may be a high-frequency core board, and the second sub-board 2 includes a second insulating layer 22, the third copper layer 21 and the fourth copper layer 23 arranged on opposite sides of the second insulating layer 22, the material of the first insulating layer 112 of the first sub-board 11 and the material of the second insulating layer 22 of the second sub-board 2 are different. The master board 1 and the second sub-board 2 are laminated and thermal compression bonded together. Since the material of the first insulating layer 112 of the first sub-board 11 and the material of the second insulating layer 22 of the second sub-board 2 are different, therefore, the resulting laminated structure is asymmetric in form, that is, the aforementioned asymmetric board 100 is obtained.

The asymmetric board 100 tends to warp in the direction with a large expansion coefficient when subjected to high temperature. Generally, the material of the second insulating layer 22 in the high-frequency core board is PTFE, and the material of the first sub-board 11 is a commonly used FR4 core board. The FR4 material used in the first insulating layer 112 has a smaller expansion coefficient than that of the second insulating layer 22. Therefore, after the master board 1 and the second sub-board 2 are laminated and thermal compression bonded together, the asymmetric board 100 is likely to warp in the direction of the second sub-board 2.

Referring to FIG. 2 together, arranging the thickness of the second sub-board 2 to be H1, where the thickness of the third copper layer 21 is H4, the thickness of the second insulating layer 22 is H5, and the thickness of the fourth copper layer 23 is H6, then H1=H4+H5+H6, and arranging the thickness of master board 1 to be H2.

Figure 1:
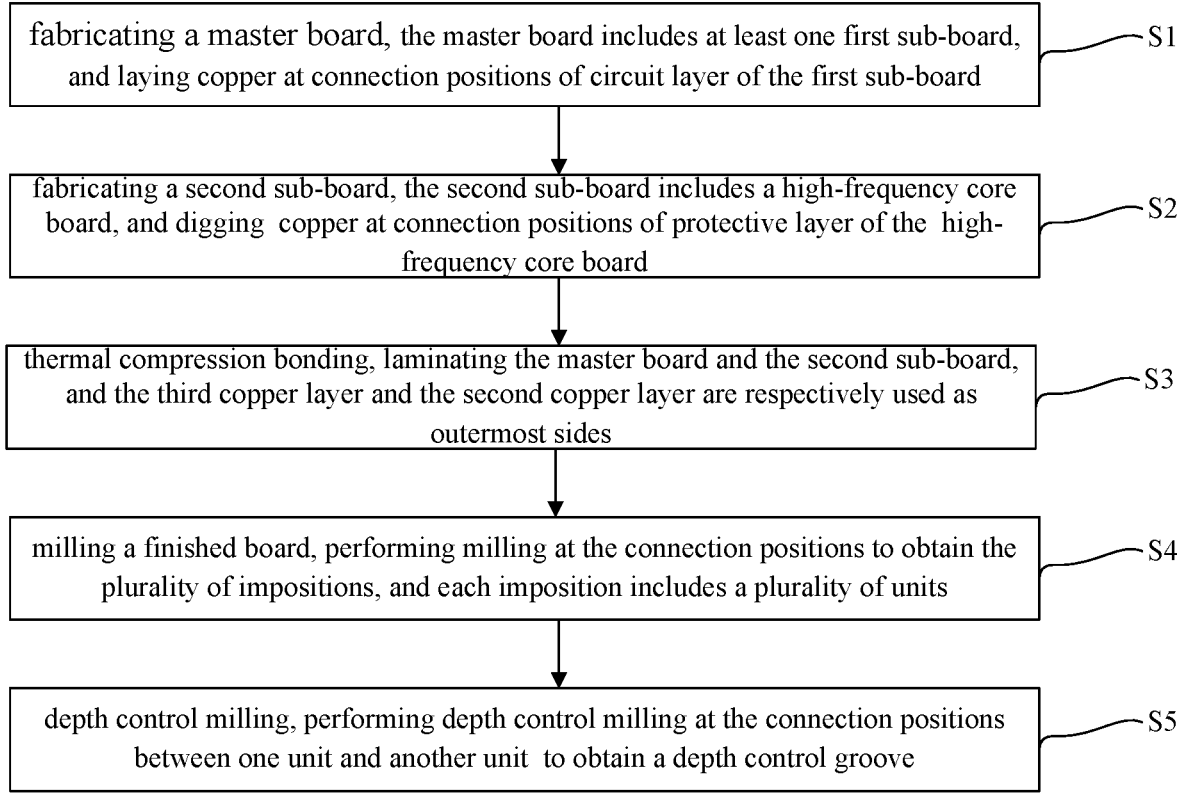
FIG. 1 is a flow chart of steps of a method for fabricating an asymmetric board provided by an embodiment of the present application.
Figure 3:
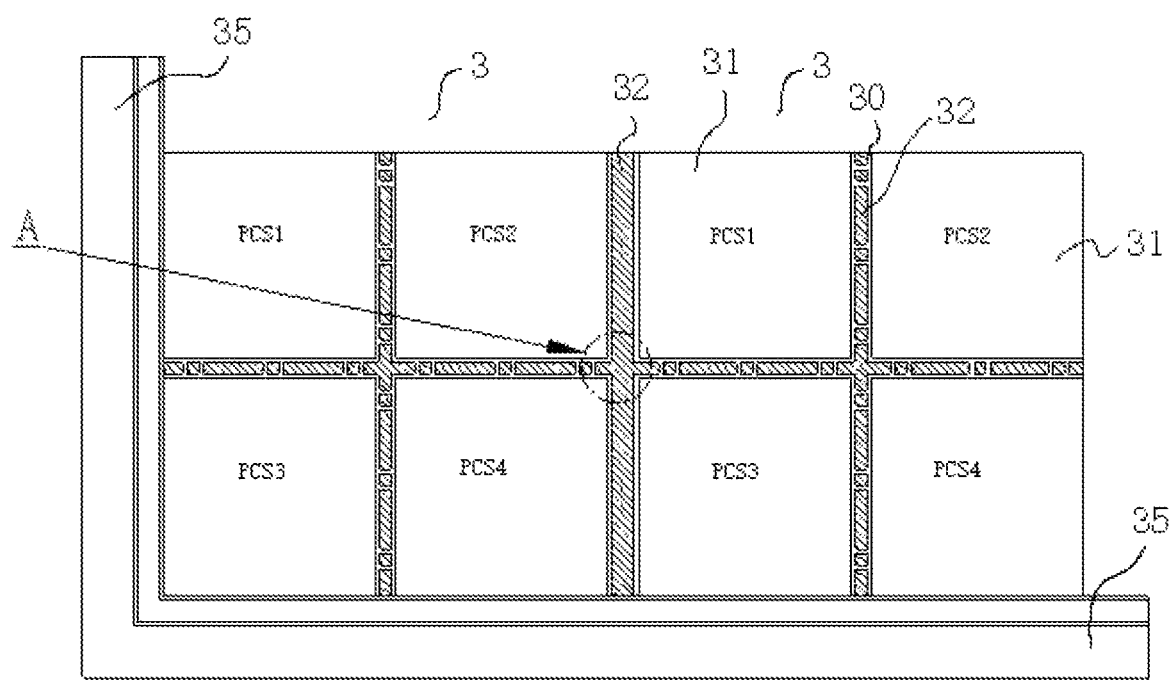
FIG. 3 is a schematic diagram of laying copper of the connection areas of the inner circuit layer in a master board.
Figure 6:
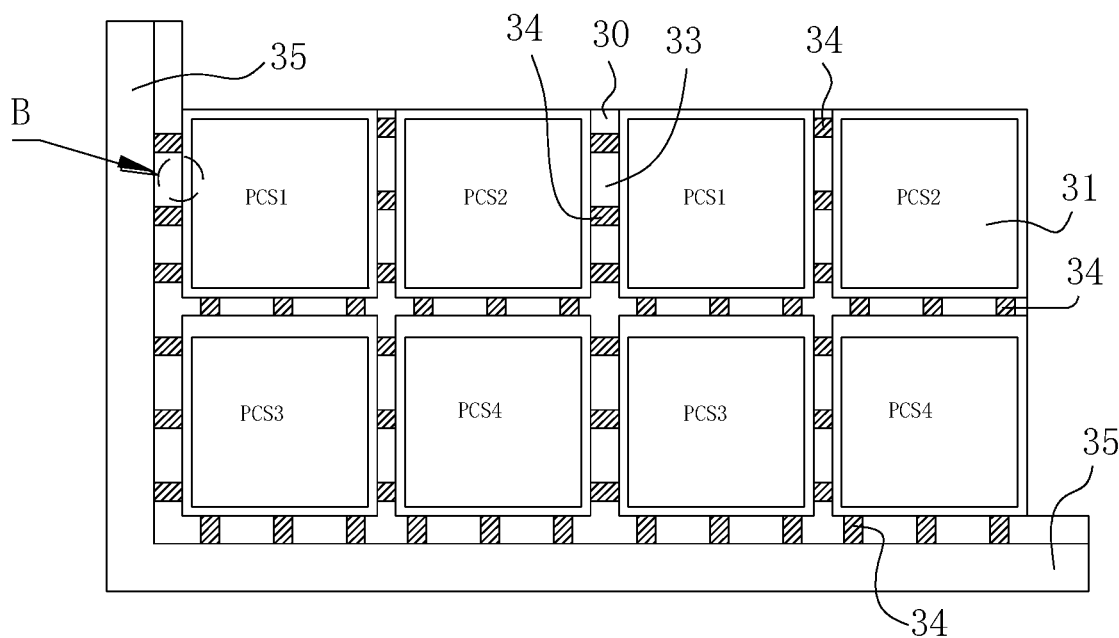
FIG. 6 is a schematic diagram of removing copper of a third copper layer of a second sub-board.

Referring to FIG. 1, an embodiment of the present application provides a method for fabricating an asymmetric board, to solve the above-mentioned warping problem of the asymmetric board 100. Specifically, the method for fabricating the asymmetric board includes:

fabricating a master board 1: referring to FIG. 2, the master board 1 includes at least one first sub-board 11;

fabricating a second sub-board 2: referring to FIG. 2 in combination;

thermal compression bonding: laminating the master board 1 and the second sub-board 2, where the third copper layer 21 is located on a side of the second sub-board 2 away from the master board 1, and at least one prepreg is placed between master board 1 and second sub-board 2, the master board 1 and the second sub-board 2 are placed into the pressing machine to perform thermal compression bonding to obtain the asymmetric board 100; as shown in FIGS. 3 and 6, a plurality of sub-boards 3 are formed on the asymmetric board 100, and each sub-board 3 includes a plurality of secondary sub-boards 31 (refer to FIGS. 3 and 6 in combination, PCS1~PCS4 represent four secondary sub-boards 31 in one sub-board 3, of course, the number of secondary sub-boards 31 in one sub-board 3 is not limited to four), the first copper layer 111 to the fourth copper layer 23 of the asymmetric board 100 corresponding to the area between one sub-board 3 and another sub-board 3, the area between one secondary sub-board 31 and another secondary sub-board 31, and the area between the secondary sub-board 31 and the board edge 35 are all used as the connection locations 30; and milling an asymmetric board; performing milling at the connection areas 30 between one sub-board 3 and another sub-board 3, the connection areas between the sub-board 3 and the board edge 35, and the connection areas 30 between one secondary sub-board 31 and another secondary sub-board 31, to obtain the plurality of sub-boards 3, and each sub-board 3 includes a plurality of secondary sub-boards 31; after milling the asymmetric board, the secondary sub-boards 31 in each sub-board 3 are connected to each other.

Figure 9:
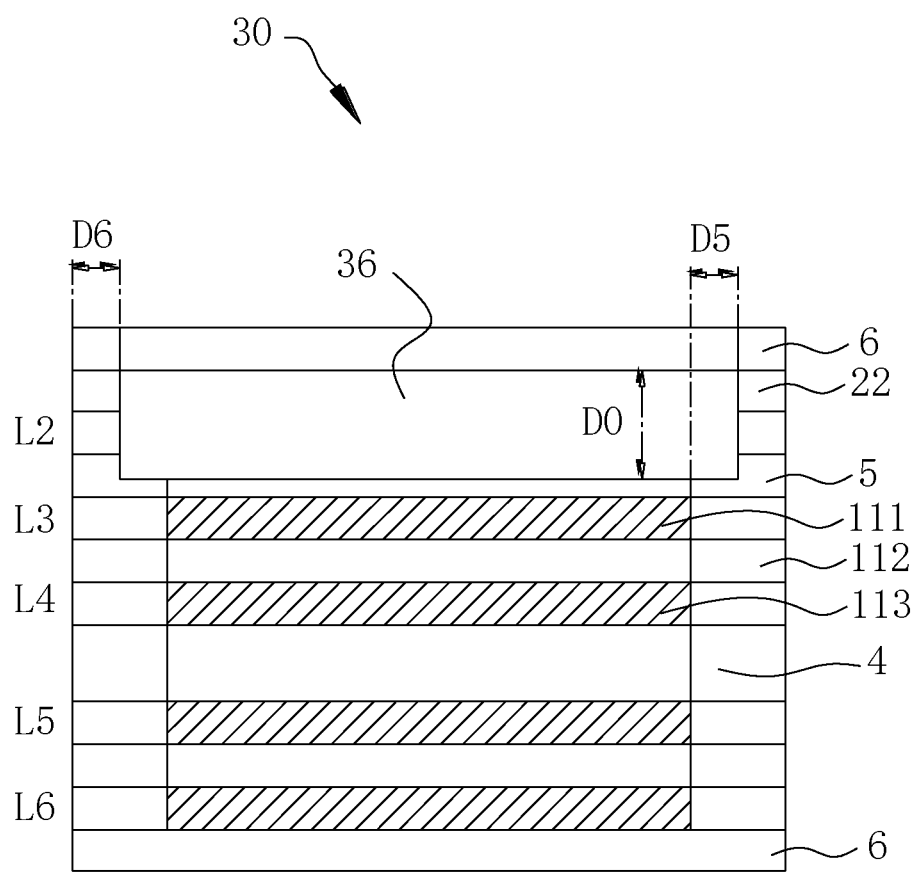
FIG. 9 is a structural schematic diagram of connection areas of the sub-board after depth control milling.

The method for fabricating the asymmetric board provided by embodiments of the present application includes at least one of the following three steps:

laying copper: in the step of fabricating the master board 1 further includes laying copper on the connection areas 30 of the circuit layer of the first sub-board 11. Specifically, except for the second copper layer 113 of an outermost layer of the master board 1, the copper is partially reserved in the connection areas 30 on the other first copper layer 111 and the second copper layer 113, to form a plurality of laying copper areas 32 spaced apart from each other, as shown in FIG. 3:

removing copper: in the step of fabricating the second sub-board 2 further includes removing copper on the connection areas 30 of the protective layer of the second sub-board 2. Specifically, on the side of the second sub-board 2 away from the master board 1, that is, on the part of the third copper layer 21 corresponding to the connection areas 30, to form a plurality of copper removed areas 33 spaced apart from each other, and connection portions 34 of copper material is formed between the copper removed areas 33, as shown in FIG. 6; and depth control milling: after the step of milling the asymmetric board, on each of the sub-boards 31, performing depth control milling at the connection areas 30 between one secondary sub-board 31 and another secondary sub-board 31 from a side of the second sub-board 2 to obtain a depth control groove 36, as shown in FIG. 9.

It should be noted that after depth control milling, one secondary sub-board 31 and another secondary sub-board 31 on each sub-board 3 are still connected, and they can be shipped as one sub-board 3.

The method for fabricating the asymmetric board provided by the embodiments of the present application includes at least one of the following three steps: removing copper on the connection areas 30 of the protective layer of the second sub-board 2, laying copper on the connection areas 30 of the circuit layer of the first sub-board 11, and after milling the asymmetric board, performing depth control milling at the connection areas 30 from a side of the second sub-board 2, any one of the three steps is beneficial to reduce the warping of the asymmetrical board 100 after heating, so as to solve the problem of virtual soldering and desoldering after the circuit board is assembled, and improve the reliability of the product.

It should be noted that the above steps of fabricating the master board 1 and the second sub-board 2 are independent of each other and do not affect each other. Therefore, the steps of fabricating the master board 1 and fabricating the second sub-board 2 can be carried out sequentially in time or at the same time. The following is an example of fabricating the master board 1 and the second sub-board 2 as an example. That is, as shown in FIG. 1, in the embodiment, step S1 is to fabricate the master board 1, step S2 is to fabricate the second sub-board 2, and step S3 is thermal compression bonding between master board 1 and second sub-board 2, step S4 is the milling the asymmetric board, and step S5 is depth control milling.

Specifically, in step S1, the following detailed steps are included:

Step S1-1, cutting: cutting an entire large copper clad laminate into a required work board according to design requirements, and pass the cut work board through the tunnel furnace to reduce the internal stress of the board; the work board includes an insulating layer and copper layers on both sides Step S1-2, transferring an inner layer pattern of the work board: coating a layer of photosensitive polymer on the copper layer on at least one side of the work board, irradiating the layer of photosensitive polymer with an exposure machine (such as a 4CCD alignment lens semi-automatically), and transferring the inner layer pattern required by the master board 1 to the photosensitive polymer;

Step S1-3, developing: placing the work board covered with photosensitive polymer into the developer, the photosensitive polymer that has not undergone polymerization reaction is developed, and the photosensitive polymer that undergoes polymerization reaction will not be developed (in negative Photopolymer as an example), the copper material that does not need to be retained on the copper layer of the work board is exposed;

Step S1-4, etching: etching the exposed copper material by an etching solution, and the copper material protected by the photosensitive polymer is retained to obtain the desired inner layer pattern;

Step S1-5, film stripping: stripping the photosensitive polymer on the copper layer by a stripping liquid to obtain the first sub-board 11; the copper layers on both sides of the first sub-board 11 are the first copper layer 111 and the second copper layer 113 respectively, and the first insulating layer 112 is located between the first copper layer 111 and the second copper layer 113;

Step S1-6, optical inspecting: optically inspecting the completed first sub-board 11 to confirm the quality;

Step S1-7, punching, use a punching machine to punch out multiple positioning holes on the first sub-board 11 (for example, 8 positioning holes, including 4 fusion positioning holes and 4 riveting positioning holes);

Step S1-8, browning: browning the first copper layer 111 and the second copper layer 113 on the opposite sides of the first sub-board 11 with a browning liquid to roughen the surface of the copper conductor;

Step S1-9, first thermal compression bonding (correspondingly, based on the time sequence, the aforementioned thermal compression bonding between the master board 1 and the second sub-board 2 is named second thermal compression bonding): laminating the browned first sub-board 11 with the prepreg (herein, the first prepreg 4, as shown in FIG. 2) according to the laminating requirements of the customer, riveting according to the positioning holes, and fully illuminating the inter layer alignment ring with an inspecting machine, and then thermal compression bonding under the high temperature environment in the pressing machine;

Step S1-10, post-compression bonding processing procedures: including target shooting, edge milling, drilling, copper sinking, board powering, outer circuit, inner layer etching, inner layer automatic optical inspecting, etc.

It should also be noted that in the master board 1 (the following are examples of the master board 1 being thermal compression bonded by multiple first sub-boards 11), referring to FIG. 2, the second copper layer 113 of the outermost layer on the side of the second sub-board 2 is used as one of the protective layers of the asymmetric board 100 during the second thermal compression bonding process, and only the various tool holes required for the subsequent processes are fabricated on the protective layer. Therefore, in the above step S1, at least one first sub-board 11 has only one side of the copper layer to fabricate the inner layer pattern according to the above steps S1-2 to S1-5, that is, in the above step S1, at least one first sub-board 11 has only the copper layer on one side of the first sub-board 11 to fabricate e the inner layer pattern according to the above steps S1-2 to S1-5.

Specifically, the inner layer pattern should include: the circuit pattern (not shown) in the secondary sub-board 31, the pattern corresponding to the laying copper area 32 on the connection areas 30 between one secondary sub-board 31 and another secondary sub-board 31, and the pattern corresponding to the laying copper area 32 on the connection areas 30 between one sub-board 3 and another sub-board 3, and the pattern corresponding to the laying copper area 32 on the connection areas 30 between the secondary sub-board 31 and the board edge 35. Therefore, in the above step S1-5, the inner layer patterns obtained are that on the first copper layer 111 (or the first copper layer 111 and the second copper layer 113) of the first sub-board 11, on the connection areas 30 between one secondary sub-board 31 and another secondary sub-board 31, on the connection areas 30 between one sub-board 3 and another sub-board 3, and on the connection areas 30 between the secondary sub-board 31 and the board edge 35.

Optionally, as shown in FIG. 3, the copper is intermittently laid on the connection areas 30 between one secondary sub-board 31 and another secondary sub-board 31, forming a plurality of laying copper areas 32 sequentially spaced apart by a certain distance; and the laying copper areas on the connection areas between one sub-board 3 and another sub-board 3, and between the secondary sub-board 31 and the board edge 35 are continuously arranged. This is because the gap between the laying copper areas 32 arranged at intervals between one secondary sub-board 31 and another secondary sub-board 31 is beneficial to release the internal stress of the first sub-board 11, thereby reducing the warping of the first sub-board 11 and the asymmetric board 100; and the connection areas between one sub-board 3 and another sub-board 3, as well as the connection areas 30 between the secondary sub-board 31 and the board edge 35, need to be removed in the subsequent steps of milling the asymmetric board. Therefore, the laying copper areas 32 do not need to be arranged at intervals. The complexity of production is lower, and the production costs can be reduced.

As shown in FIG. 2, taking a six-layer asymmetric board as an example, the layer L1 and layer L2 are the third copper layer 21 and the fourth copper layer 23 of the second sub-board 2 respectively, and the layer L1 is the protective layer on the side of the second sub-board 2, layer L3 to layer L6 are located on the master board 1 composed of two first sub-boards 11 laminated, and the layer L6 is the protective layer on the side of the master board 1 during the second thermal compression bonding process. In step S1, only the various tool holes required for the subsequent process are fabricated on the second copper layer 113 used as the layer L6, and the first copper layer 111 and second copper layer 113 used as the layer L3 to layer L5 respectively are normally produced the above-mentioned inner layer patterns according to the above steps S1-2 to Step S1-5. In this way, the laying copper areas 32 arranged at intervals can reduce the warping of the master board 1, thereby reducing the warping of the asymmetric board 100 caused by the master board 1 and the second sub-board 2 during the second thermal compression bonding process, and thereby reduce the warping of the finished circuit board caused by heat during the customer's assembly process; in addition, the arrangement of multiple laying copper areas 32 can enhance the rigidity of the master board 1.

Figure 4:
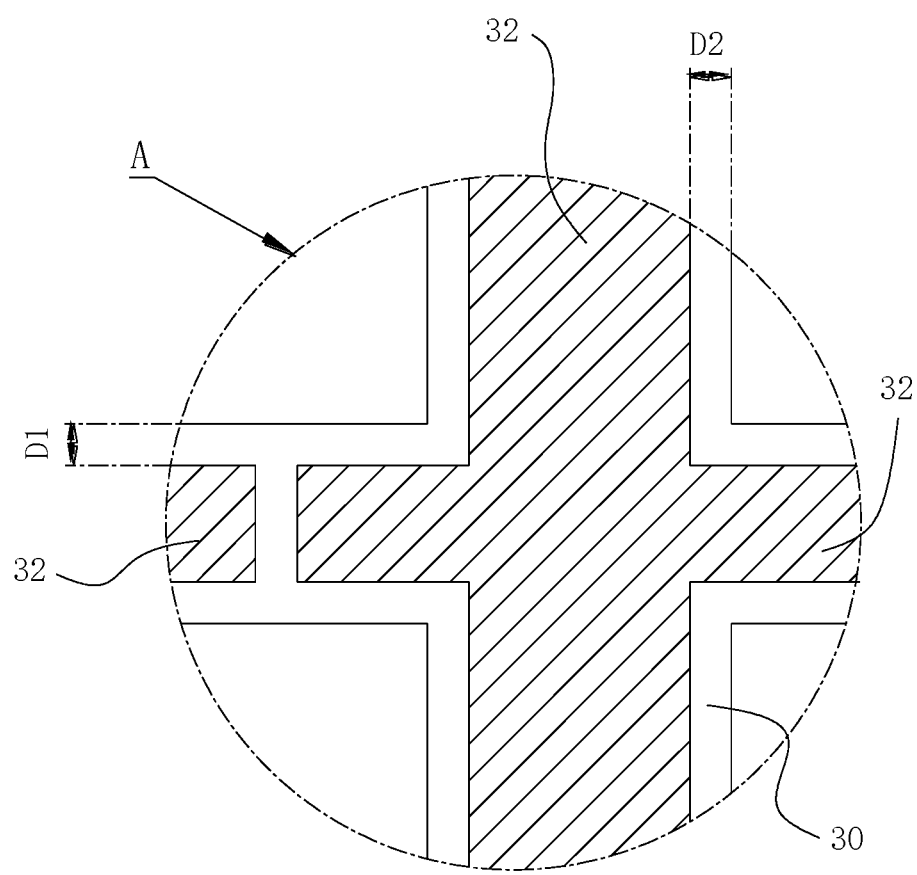
FIG. 4 is an enlarged view of part A in FIG. 3.

In addition, as shown in FIG. 4, the shapes of the multiple laying copper areas 32 in the connection areas 30 between one secondary sub-board 31 and another secondary sub-board 31 may not necessarily be completely consistent. In this embodiment, among the multiple laying copper areas 32 in the connection areas 30 between one secondary sub-board 31 and another secondary sub-board 31, two adjacent laying copper areas 32 spaced apart have the same shape. As shown in FIG. 4, the length and the width of one laying copper area 32 are close or even equal, and the length of one laying copper area 32 adjacent to it is obviously larger than its width and in a shape of elongated (for this specific effect, please combine the following step S4).

Specifically, in step S2, the step S2 includes:

Step S2-1, cutting: cutting an entire large copper clad laminate into a required work board according to design requirements, and pass the cut work board through the tunnel furnace to reduce the internal stress of the board;

Step S2-2, transferring a pattern of the work board: coating a layer of photosensitive polymer on the copper layer on at least one side of the work board, irradiating the layer of photosensitive polymer with an exposure machine (such as a 4CCD alignment lens semi-automatically), and transferring the inner layer pattern required by the second sub-board 2 to the photosensitive polymer;

Step S2-3, developing: placing the work board covered with photosensitive polymer into the developer, the photosensitive polymer that has not undergone polymerization reaction is developed, and the photosensitive polymer that undergoes polymerization reaction will not be developed (in negative Photopolymer as an example), the copper material that does not need to be retained on the copper layer of the work board is exposed;

Step S2-4, etching: etching the exposed copper material by an etching solution, and the copper material protected by the photosensitive polymer is retained to obtain the desired patterns on the copper layers of both sides;

Step S2-5, film stripping: stripping the photosensitive polymer on the copper layer by a stripping liquid to obtain the second sub-board 2; the copper layers on both sides of the second sub-board 2 are the third copper layer 21 and the fourth copper layer 23 respectively, and the second insulating layer 22 is located between the third copper layer 21 and the fourth copper layer 23;

Step S2-6, optical inspecting: optically inspecting the completed second sub-board 2 to confirm the quality;

Step S2-7, punching, use a punching machine to punch out multiple positioning holes on the second sub-board 2 (for example, 8 positioning holes, including 4 fusion positioning holes and 4 riveting positioning holes).

It should be noted here that in the step S2, since the layer L1, that is, the third copper layer 21, is used as another protective layer of the asymmetric board 100, the inner layer circuit pattern is normally fabricated on the layer L2, that is, on the fourth copper layer 23.

Figure 5:
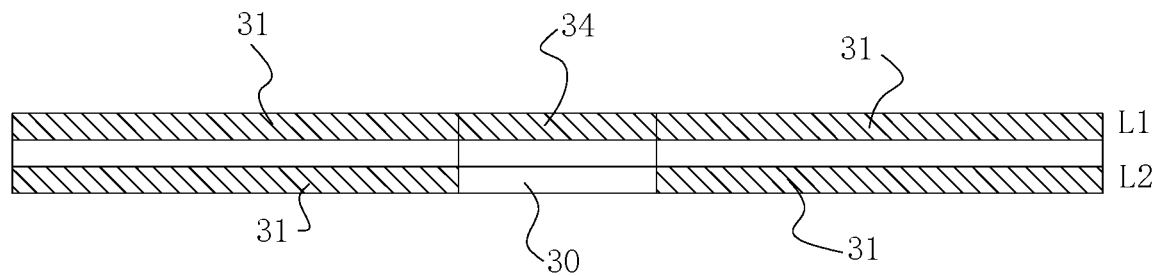
FIG. 5 is a schematic longitudinal cross-sectional view of a second sub-board.

Specifically, the patterns of the second sub-board 2 should include: pattern on the connection areas 30 between one secondary sub-board 31 and another secondary sub-board 31 formed on the third copper layer 21 that correspond to pattern other than the copper removed area 33 (that is, the pattern of the connection portion 34), the connection areas 30 between one sub-board 3 and another sub-board 3 corresponds to the pattern other than the copper removed area 33, and the connection areas 30 between the secondary sub-board 31 and the board edge 35 corresponds to the pattern other than the copper removed area 33, the inner layer circuit pattern (not shown, and at this time, the inner layer circuit pattern is not fabricated in the secondary sub-board 31 of the layer L1 to serve as a protective layer) of the secondary sub-board 31 is formed on the fourth copper layer 23. Therefore, in the above step S2-5, the obtained patterns are: the third copper layer 21 of the second sub-board 2 is provided with the multiple connection portions 34 spaced apart on the connection areas 30 between one secondary sub-board 31 and another secondary sub-board 31, the multiple connection portions 34 spaced apart on the connection areas 30 between one sub-board 3 and another sub-board 3, and the multiple connection portions 34 spaced apart on the connection areas 30 between the secondary sub-board 31 and the board edge 35, as shown in FIG. 6, and the fourth copper layer 23 is provided with the inner circuit pattern of the secondary sub-board 31, as shown in FIG. 5.

By partially removing copper on the connection areas 30 of the layer L1, part of the stress of the second insulating layer 22 of the second sub-board 2 can be released, thereby reducing the degree of warping of the second sub-board 2 after being heated, and further, reduce the degree of warping of the finished circuit board after assembly.

In an optional embodiment, in the step S2, the connection portions 34 are arranged to correspond to the positions of the partial laying copper areas 32 in step S1. In this way, in the thickness direction of the asymmetric board 100, the connection portions 34 always have corresponding laying copper areas 32, which is more convenient for thermal compression bonding between the connection portions 34 and the laying copper areas 32 (for details, please continue to combine the following step S3).

In step S3, the specific steps of the second thermal compression bonding are: laminating at least one prepreg (here defined as the second prepreg 5, referring to FIG. 2) between the master board 1 and the second sub-board 2 obtained above according to laminating requirements of the customer, positioning through the positioning holes, fully illuminating the inter layer alignment ring with an inspecting machine, and thermal compression bonding in a high temperature environment.

In an optional embodiment, in the second thermal compression bonding, the temperature drop rate is ranged from 2° C./min~3° C./min, for example, keep 2° C./min. Due to the low temperature drop rate, the internal stress of the asymmetric board 100 can be further reduced, thereby reducing its warping after heating.

Referring to FIG. 3 and FIG. 6 together, in a specific embodiment, the connection portions 34 on the layer L1 correspond to the two laying copper areas 32 arranged at intervals on the layer L3 to the layer L5. That is, corresponding to the laying copper area 32 with a smaller length. In this way, during the second thermal compression bonding, there will be no case where there is no layer copper area 32 under the connection portion 34, and the deformation of the connection portion 34 during the thermal compression bonding process and the deformation of the asymmetric board 100 can be avoided.

Figure 8:
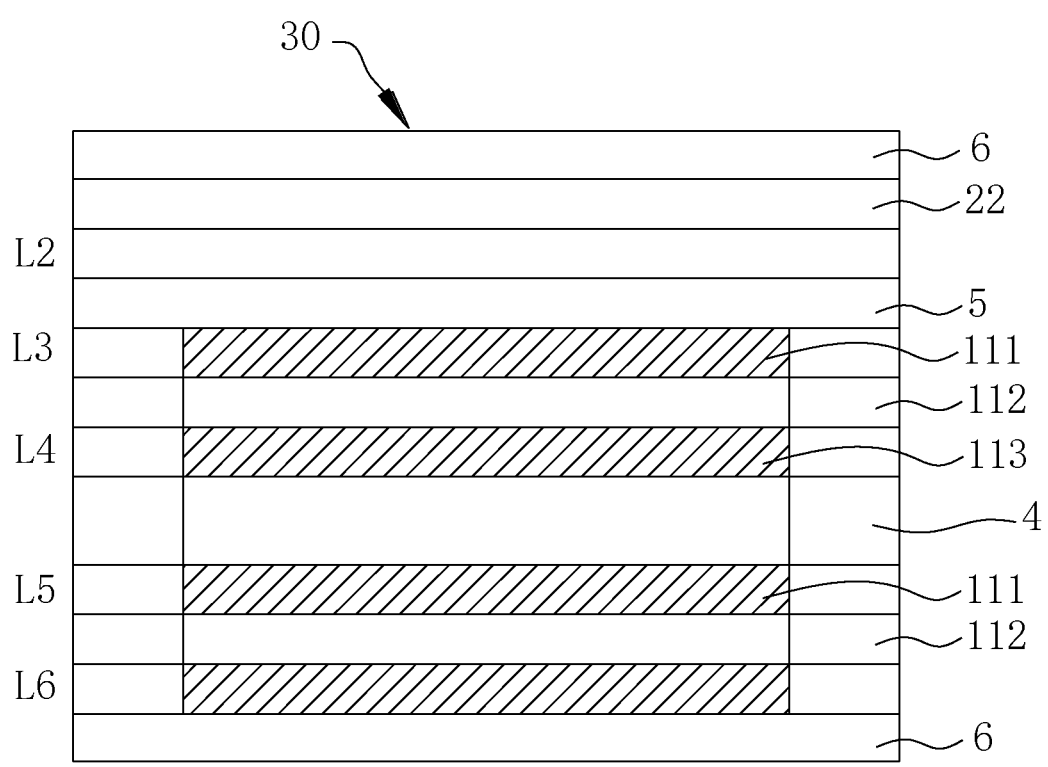
FIG. 8 is a structural schematic diagram of connection areas of the sub-board before depth control milling.

In addition, in the step S3, it also includes browning, laser drilling, plasma treatment, copper immersion and board powering, thickening of the board, and outer layer circuit fabricating (fabricating the outer layer circuit on secondary sub-boards of the layer L1 and the layer L6, and after the outer layer circuit is fabricated, the connection portion 34 on the layer L1 is removed, and the connection areas 30 of the layer L6 can be left with the copper pattern in consistent with the laying copper of the layers L3~L5, or in other words, a laying copper area 32 is also formed on the connection areas of the layer L6), pattern plating, outer layer etching, solder resist ink printing, character printing, and testing and so on. Referring to FIGS. 8 and 9 together, the outermost layer of the sub-board 3 is the solder resist layer 6 formed by solder resist ink printing.

After step S3, go to step S4, the milling asymmetric board: performing milling on the obtained asymmetric board 100, that is, performing milling the connection areas 30 between one sub-board 3 and another sub-board 3, the connection areas 30 between the sub-board 3 and the board edge 35, and the connection areas 30 between one secondary sub-board 31 and another secondary sub-board 31, respectively; cutting off the connection between one sub-board 3 and another sub-board 3, the connection between the sub-board 3 and the board edge 35, and partial connection between one secondary sub-board 31 and another secondary sub-board 31, to obtain a plurality of sub-boards 3, and each sub-board 3 includes a plurality of secondary sub-boards 31 connected to each other.

In each sub-board 3 obtained, there is no connection portion 34 on the connection areas 30 of the layer L1 between one secondary sub-board 31 and another secondary sub-board 31, and laying copper areas 32 are provided on the connection areas 30 of the layer L3 to the layer L6. That is, after the step S4, in each sub-board 3, laying copper areas 32 are reserved between one secondary sub-board 31 and another secondary sub-board 31 on the connection areas 30 between the layer L3 to the layer L6.

In a specific embodiment, referring to FIG. 3 together, it may be that the long-length and elongated laying copper areas 32 in the connection areas 30 are milled, and the other laying copper areas 32 are reserved. Of course, this is only an example here to show that position for milling asymmetric board can be performed according to the position of a part of the laying copper areas 32, and the shape of the laying copper areas 32 are not particularly limited. In practical applications, the laying copper areas 32 are arranged according to the connection requirements between one secondary sub-board 31 and another secondary sub-board 31 after milling asymmetric board.

Figure 7:
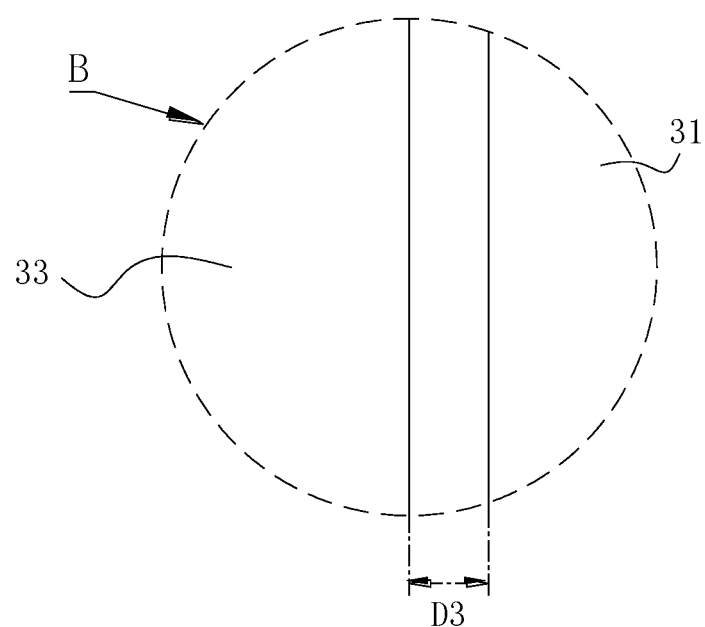
FIG. 7 is an enlarged view of part B in FIG. 6.

In an optional embodiment, referring to FIG. 6 and FIG. 7 in combination, in order to prevent the alignment deviation during milling board in the step S4, in the above step S2, a sufficient distance should be reserved between the copper cutting area 33 and the position for milling asymmetric board, that is the width of the copper removed area 22 should be smaller than the width of the position for milling asymmetric board. Specifically, the distance between the copper removed area 33 and the position for milling asymmetric board is D3, and D3≥0.1 mm, that is, the edge of the copper digging area 33 close to the secondary sub-board 31 is retracted by at least 0.1 mm relative to the edge of the position for milling asymmetric board adjacent to the secondary sub-board 31.

Referring to FIG. 1, in one embodiment, after the milling asymmetric board of step S4 is completed, then go to step S5, in the connection areas 30 between one secondary sub-board 31 and another secondary sub-board 31 of each sub-board 3, depth control milling from a side of the second sub-board 2, to obtain the depth control groove 36. In this way, on the one hand, the second core board 2 is partially removed, which can reduce its expansion after the second thermal compression bonding and the heating process of the subsequent assembly process of the customer, thereby reducing the warping of the second sub-board 2 and the asymmetric board 100; on the other hand, the connection areas 30 between one secondary sub-board 31 and another secondary sub-board 31 is partially removed in height, and the depth control groove 36 can make room for the expansion of the secondary sub-board 31 and reduce the thermal stress of the secondary sub-board 31, especially on the side of the second sub-board 2, the warping of the second sub-board 2 and the asymmetric board 100 can also be reduced.

Optionally, the depth control milling is arranged to perform depth control milling on the asymmetric board 100 from the side of the third copper layer 21 to the connection areas between the secondary sub-boards 31. There is no doubt that, since one secondary sub-board 31 and another secondary sub-board 31 in each sub-board 3 are connected together by a part of the second insulating layer 22, a part of the second prepreg 5, the laying copper area 32, and a part of the first prepreg 4 between the laying copper areas 32. Therefore, depth control milling is implemented correspondingly to above the remaining laying copper areas 32, that is, the position of the deep control groove 36 corresponds to the position of the remaining laying copper area 32 until it reaches the second prepreg 5 between the master board 1 and the second sub-board 2. The result of this is that depth control milling removes part of the second sub-board 2 in connection areas 30 and part of the second prepreg 5. That is, the depth control milling is configured for controlling to mill penetrating the second sub-board 2 and does not damage the first copper layer 111 on the side of the first sub-board 11 closest to the second sub-board 2. The advantage is that it can avoid that the depth D0 of the deep control groove 36 is too large, which will cause the secondary sub-board 31 to break and affect the shipment.

Therefore, the minimum depth of the depth control groove 36 is $D0_{min}=H1-H4+\Delta X$, and the maximum depth of the depth control groove 36 is $D0_{max}=H1-H4+H3-\Delta X$, where H3 represents the thickness of the second prepreg 5, and $\Delta X$ represents the precision tolerance of the depth control milling machine. Among them, the thickness of the solder resist layer 6 is relatively small compared to other layers and can be ignored.

For example, in a specific embodiment, H1 is 0.186 mm, H4 is 0.018 mm, H3 is 0.08 mm, and the precision tolerance $\Delta X$ of the depth control milling machine is 0.025 mm. Therefore, the minimum depth $D0_{min}$ of the depth control groove 36 is 0.193 mm, and the maximum depth $D0_{max}$ of the depth control groove 36 is 0.223 mm. This is only an example, in other optional embodiments, depending on the laminating structure of the specific asymmetric board 100 and the depth control milling machine, the depth D0 of the depth control groove 36 is allowed to have other ranges, which are not particularly limited.

In practical applications, in order to ensure the release effect of thermal stress, the depth D0 of the depth control groove 36 should be as close to $D0_{max}$ as possible.

In an optional embodiment, in each sub-board 3, the number of the depth control grooves 36 is multiple, and the positions of the depth control grooves 36 correspond to the positions of the connection portions 34 one by one. That is, in step S5, depth control milling is started at each connection portion 34.

In an optional embodiment, referring to FIG. 8 and FIG. 9 in combination, the width of the depth control groove 36 is greater than the width of the laying copper area 32 in the connection areas 30 of the inner layer circuit (layer L3 to layer L5). Specifically, the distance of the single side of the depth control groove 36 exceeds the single side of the laying copper area 32 of the inner layer circuit of the connection areas (the area filled with diagonal lines in FIGS. 8 and 9 represents the laying copper area 32 in the connection area) is D5, and D5≥0.075 mm.

In an optional embodiment, referring to FIGS. 8 and 9 in combination, the width of the depth control groove 36 must be smaller than the width of the connection areas 30. Specifically, the distance between the edge of the depth control groove 36 and the edge of the secondary sub-board 31 is D6, and D6≥0.075 mm.

Optionally, due to the alignment error in step S4 and step S5, the depth control milling machine and other equipment used also have precision tolerances, in order to avoid exposing the copper laid on the edges of the inner layer circuit layers (layer L3 to layer L5) of the sub-board 3 and the edges of the depth control grooves, as shown in FIG. 4, a unilateral indentation distance of the laying copper areas 32 between one secondary sub-board 31 and another secondary sub-board 31 relative to the connection areas 30 is D1, that is, the distance between the edge of the laying copper area 32 between one secondary sub-board 31 and another secondary sub-board 31 and the edge of the connection areas 30 is D1, and D1≥0.15 mm.

According to the different forms of the secondary sub-boards 31, this includes that the unilateral indentation distance of the laying copper areas 32 in the connection areas 30 along the short side direction of the secondary sub-board 31 between one secondary sub-board 31 and another secondary sub-board 31 relative to the connection areas 30 is greater than or equal to 0.15 mm, the unilateral indentation distance of the laying copper areas 32 in the connection areas 30 along the long side direction of the secondary sub-board 31 between one secondary sub-board 31 and another secondary sub-board 31 relative to the connection areas 30 is greater than or equal to 0.2 mm. Further optionally, the unilateral indentation distance of the laying copper areas 32 in the connection areas 30 along the short side direction of the secondary sub-board 31 between one secondary sub-board 31 and another secondary sub-board 31 relative to the connection areas 30 is greater than or equal to 0.15 mm, the unilateral indentation distance of the laying copper areas 32 in the connection areas 30 along the long side direction of the secondary sub-board 31 between one secondary sub-board 31 and another secondary sub-board 31 relative to the connection areas 30 is greater than or equal to 0.2 mm. It should be noted here that the aforementioned long side direction is only based on the rectangular secondary sub-board 31 shown in FIG. 3 and the position shown by the reference symbol "D1" in FIG. 4, and the long side of the secondary sub-board 31 is the up and down directions of the paper surface shown in FIG. 3, the short side of the secondary sub-board 31 is the left and right directions of the paper surface shown in FIG. 3. However, it is not limited to this. In actual production, the long side direction and the short side direction of the secondary sub-board 31 can be set according to specific needs.

Therefore, in the embodiment, the unilateral indentation distance of the laying copper areas 32 in the connection areas 30 along the long side direction of the secondary sub-board 31 between one secondary sub-board 31 and another secondary sub-board 31 relative to the connection areas 30 is the gap distance between the laying copper area 32 between one secondary sub-board 31 and another secondary sub-board 31 and the secondary sub-board 31, and the gap distance is greater than or equal to 0.2 mm; the unilateral indentation distance of the laying copper areas 32 in the connection areas 30 along the short side direction of the secondary sub-board 31 between one secondary sub-board 31 and another secondary sub-board 31 relative to the connection areas 30 is the gap distance between the two adjacent laying copper areas 32 in the connection areas 30 between one secondary sub-board 31 and another secondary sub-board 31 and the secondary sub-board 31, and the gap distance is greater than or equal to 0.15 mm.

Further, in an optional embodiment, the gap distance between the laying copper area 32 between one secondary sub-board 31 and another secondary sub-board 31 and the secondary sub-board 31 is greater than or equal to 0.20 mm.

The distances between the laying copper area 32 between one sub-board 3 and another sub-board 3, the laying copper area 32 between the secondary sub-board 31 and the board edge 35 and the adjacent secondary sub-boards 31 are all D2, and D2≥0.2 mm.

The aforementioned embodiments are only preferred embodiments of the present application, and should not be regarded as being limitation to the present application. Any modification, equivalent replacement, improvement, and so on, which are made within the spirit and the principle of the present application, should be included in the protection scope of the present application.

What is claimed is:

1. A method for fabricating an asymmetric board, comprising:
   fabricating a master board, wherein the master board comprises at least one first sub-board, each first sub-board comprises a first insulating layer, and a first copper layer and a second copper layer disposed on opposite sides of the first insulating layer;
   fabricating a second sub-board, wherein the second sub-board comprises a second insulating layer, and a third copper layer and a fourth copper layer disposed on opposite sides of the second insulating layer, and material of the first insulating layer is different from that of the second insulating layer;
   thermal compression bonding, laminating the master board and the second sub-board after placing a prepreg between the master board and the second sub-board, wherein the third copper layer is located on a side of the second sub-board away from the master board, the second copper layer is located on a side of the first sub-board away from the second sub-board, and the asymmetric board is formed by thermal compression bonding the master board and the second sub-board; a plurality of sub-boards are formed on the asymmetric board, and the plurality of sub-boards are connected; each sub-board comprises a plurality of secondary sub-boards, connection areas are correspondingly formed between one sub-board and another sub-board, between one secondary sub-board and another secondary sub-board, as well as between the secondary sub-board and a board edge of the asymmetric board on each of the first copper layer, the second copper layer, the third copper layer, and the fourth copper layer; and
   milling the asymmetric board, performing milling at the connection areas between one sub-board and another sub-board, the connection areas between the sub-board and the board edge, and the connection areas between one secondary sub-board and another secondary sub-board, to obtain the plurality of sub-boards, and each sub-board comprises a plurality of secondary sub-boards connected to each other;
   wherein the method for fabricating the asymmetric board further comprises the following three steps:
   laying copper; in the step of fabricating the master board, laying copper on the connection areas of the master board except for the second copper layer of an outermost layer to obtain laying copper areas;
   digging copper; in the step of fabricating the second sub-board, digging copper on the connection areas of the third copper layer; and
   after the step of milling the asymmetric board, on each of the sub-boards, performing depth control milling at the connection areas between one secondary sub-board and another secondary sub-board from a side of the second sub-board to obtain a depth control groove.

2. The method for fabricating an asymmetric board according to claim 1, wherein the laying copper areas between one secondary sub-board and another secondary sub-board are arranged apart from each other, and lengths of two adjacent laying copper areas between one secondary sub-board and another secondary sub-board are different; the laying copper areas between one sub-board and another sub-board are continuously arranged, and the laying copper areas between the secondary sub-board and the board edge are continuously arranged.

3. The method for fabricating an asymmetric board according to claim 2, wherein in the multiple laying copper areas between one secondary sub-board and another secondary sub-board, and adjacent two laying copper areas spaced apart have a same shape.

4. The method for fabricating an asymmetric board according to claim 2, wherein an unilateral indentation distance of the laying copper area between one secondary sub-board and another secondary sub-board relative to a corresponding connection area is greater than or equal to 0.15 mm; a distance from the laying copper area between one sub-board and another sub-board to the secondary sub-board is greater than or equal to 0.2 mm, and a distance from the laying copper area between the secondary sub-board and the board edge to the secondary sub-board is greater than or equal to 0.2 mm.

5. The method for fabricating an asymmetric board according to claim 1, wherein a width of a copper removed area is smaller than a width of an area for milling asymmetric board in the step of milling the asymmetric board.

6. The method for fabricating an asymmetric board according to claim 5, wherein a distance between the copper removed area and the area for milling asymmetric board in the step of milling the asymmetric board is greater than or equal to 0.1 mm.

7. The method for fabricating an asymmetric board according to claim 1, wherein the step of depth control milling is configured for controlling to mill penetrating the second sub-board and not damage the first copper layer of the master board.

8. The method for fabricating an asymmetric board according to claim 7, wherein in the step of removing copper, copper removed area and connection portions located outside the copper removed area are formed on the connection areas of the third copper layer, the step of thermal compression bonding further comprises removing the connection portions, and the depth control groove having a minimum depth $D0\ min=H1-H4+\Delta X$ and a maximum depth $D0\ max=H1-H4+H3-\Delta X$, wherein the H1 represents a thickness of the third copper layer, the H3 represents a thickness of the prepreg, the H4 represents a thickness of the third copper layer, and the $\Delta X$ represents a precision tolerance of a depth control milling machine.

9. The method for fabricating an asymmetric board according to claim 1, wherein in the step of milling the asymmetric board, the position for milling asymmetric board corresponds to a position of part of the laying copper areas.

10. The method for fabricating an asymmetric board according to claim 9, wherein in the step of removing copper, a copper removed area and connection portions located outside the copper removed area are formed on the connection areas of the third copper layer, and the connection portions correspond to positions of remaining laying copper areas.

11. The method for fabricating an asymmetric board according to claim 9, wherein the method further comprises the step of depth control groove, a width of the depth control groove is larger than a width of the layer copper areas in connection areas of an inner circuit of the second sub-board.

12. The method for fabricating an asymmetric board according to claim 11, wherein a distance of a single side of the depth control groove exceeding a single side of the laying copper area in the connection areas in each of the sub-boards is greater than or equal to 0.075 mm.

13. The method for fabricating an asymmetric board according to claim 11, wherein in the step of depth control milling, the depth control milling is performed on each of the connection portions, and in each of the sub-boards, a number of the depth control grooves is multiple.

14. The method for fabricating an asymmetric board according to claim 1, wherein a distance between an edge of the depth control groove and an edge of the secondary sub-board adjacent to the depth control groove is greater than or equal to 0.075 mm.

15. A method for fabricating an asymmetric board, comprising:
fabricating a master board, wherein the master board comprises at least one first sub-board, each first sub-board comprises a first insulating layer, and a first copper layer and a second copper layer disposed on opposite sides of the first insulating layer;
fabricating a second sub-board, wherein the second sub-board comprises a second insulating layer, and a third copper layer and a fourth copper layer disposed on opposite sides of the second insulating layer, and material of the first insulating layer is different from that of the second insulating layer;
thermal compression bonding, laminating the master board and the second sub-board after placing a prepreg between the master board and the second sub-board, wherein the third copper layer is located on a side of the second sub-board away from the master board, the second copper layer is located on a side of the first sub-board away from the second sub-board, and the asymmetric board is formed by thermal compression bonding the master board and the second sub-board; a plurality of sub-boards are formed on the asymmetric board, and the plurality of sub-boards are connected; each sub-board comprises a plurality of secondary sub-boards, connection areas are correspondingly formed between one sub-board and another sub-board, between one secondary sub-board and another secondary sub-board, as well as between the secondary sub-board and a board edge of the asymmetric board on each of the first copper layer, the second copper layer, the third copper layer, and the fourth copper layer; and
milling the asymmetric board, performing milling at the connection areas between one sub-board and another sub-board, the connection areas between the sub-board and the board edge, and the connection areas between one secondary sub-board and another secondary sub-board, to obtain the plurality of sub-boards, and each sub-board comprises a plurality of secondary sub-boards connected to each other; and
after the step of milling the asymmetric board, on each of the sub-boards, performing depth control milling at the connection areas between one secondary sub-board and another secondary sub-board from a side of the second sub-board to obtain a depth control groove.

* * * * *